United States Patent
Van Oosten et al.

(10) Patent No.: US 9,817,256 B2
(45) Date of Patent: Nov. 14, 2017

(54) OPTICAL DEVICE WITH POWER SUPPLY SYSTEM

(71) Applicant: MERCK PATENT GMBH, Darmstadt (DE)

(72) Inventors: Casper Van Oosten, Waalre (NL); Felix Schlosser, Wurzburg (DE)

(73) Assignee: Merck Patent GmbH, Darmstadt (DE)

( * ) Notice: Subject to any disclaimer, the term of this patent is extended or adjusted under 35 U.S.C. 154(b) by 135 days.

(21) Appl. No.: 14/904,210

(22) PCT Filed: Jul. 10, 2014

(86) PCT No.: PCT/EP2014/064789
§ 371 (c)(1),
(2) Date: Jan. 11, 2016

(87) PCT Pub. No.: WO2015/004222
PCT Pub. Date: Jan. 15, 2015

(65) Prior Publication Data
US 2016/0147100 A1    May 26, 2016

(30) Foreign Application Priority Data
Jul. 11, 2013   (EP) .................... 13176024

(51) Int. Cl.
*G02F 1/133*   (2006.01)
*H01L 31/0468*   (2014.01)
(Continued)

(52) U.S. Cl.
CPC ............ *G02F 1/13306* (2013.01); *E06B 9/24* (2013.01); *G02F 1/163* (2013.01); *G02F 1/172* (2013.01);
(Continued)

(58) Field of Classification Search
CPC ....... G02F 1/13306; G02F 2001/13324; G02F 1/163; G02F 1/172; G02F 1/137;
(Continued)

(56) References Cited

U.S. PATENT DOCUMENTS 5,384,653 A * 1/1995 Benson .................. E06B 3/6722
                                                                  359/265
6,055,089 A * 4/2000 Schulz .................... G02F 1/163
                                                                  136/251
(Continued)

OTHER PUBLICATIONS

International Search Report dated Aug. 22, 2014 issued in corresponding to PCT/EP2014/064789 application (pp. 1-2).

*Primary Examiner* — Jia Pan
(74) *Attorney, Agent, or Firm* — Millen White Zelano & Branigan, P.C.

(57) ABSTRACT

The invention pertains to an optical device comprising at least one glass or polymer area, whereby an active matrix is located in contact with the at least one glass or polymer area, the optical device comprises a power supply system located between a first auxiliary plane and a second auxiliary-plane parallel to a glass or polymer area, and a distance L from a third auxiliary-plane or a fourth auxiliary-plane approximately perpendicular to the glass or polymer area. The invention pertains also to a power supply system for such an optical device.

10 Claims, 9 Drawing Sheets

(51) Int. Cl.
*H02S 40/38* (2014.01)
*E06B 9/24* (2006.01)
*G02F 1/163* (2006.01)
*G02F 1/17* (2006.01)

(52) U.S. Cl.
CPC .......... *H01L 31/0468* (2014.12); *H02S 40/38* (2014.12); *E06B 2009/2464* (2013.01); *G02F 2001/13324* (2013.01)

(58) Field of Classification Search
CPC ....... G02F 1/13725; G02F 2001/13775; H01L 31/0468; H02S 40/38; E06B 9/24; E06B 2009/2464
See application file for complete search history.

(56) References Cited

U.S. PATENT DOCUMENTS

| | | | |
|---|---|---|---|
| 6,710,823 B2* | 3/2004 | Faris ..................... | B82Y 15/00 349/115 |
| 7,099,665 B2* | 8/2006 | Taylor ................ | H04B 7/18508 455/430 |
| 7,259,730 B2 | 8/2007 | O'Keeffe | |
| 8,213,074 B1* | 7/2012 | Shrivastava .............. | E06B 9/24 345/105 |
| 2009/0027759 A1* | 1/2009 | Albahri ..................... | B60J 3/04 359/277 |
| 2015/0219975 A1* | 8/2015 | Phillips .................... | E06B 9/24 359/275 |

* cited by examiner

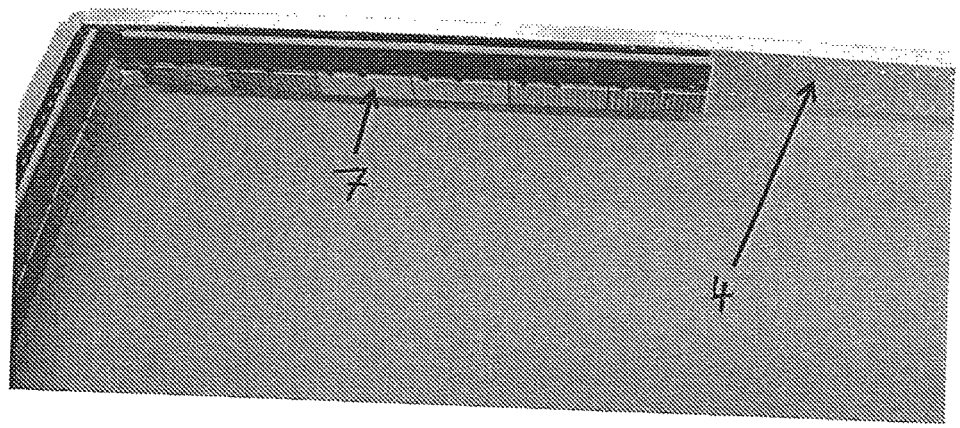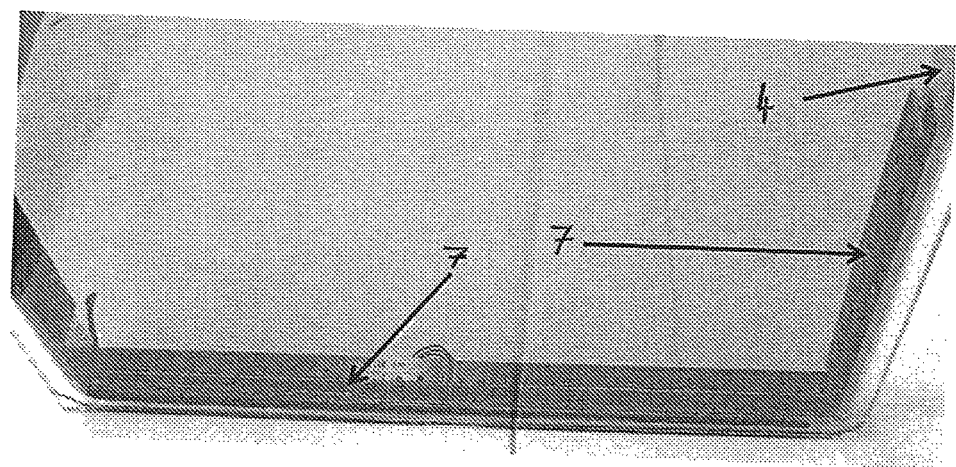
Fig 4

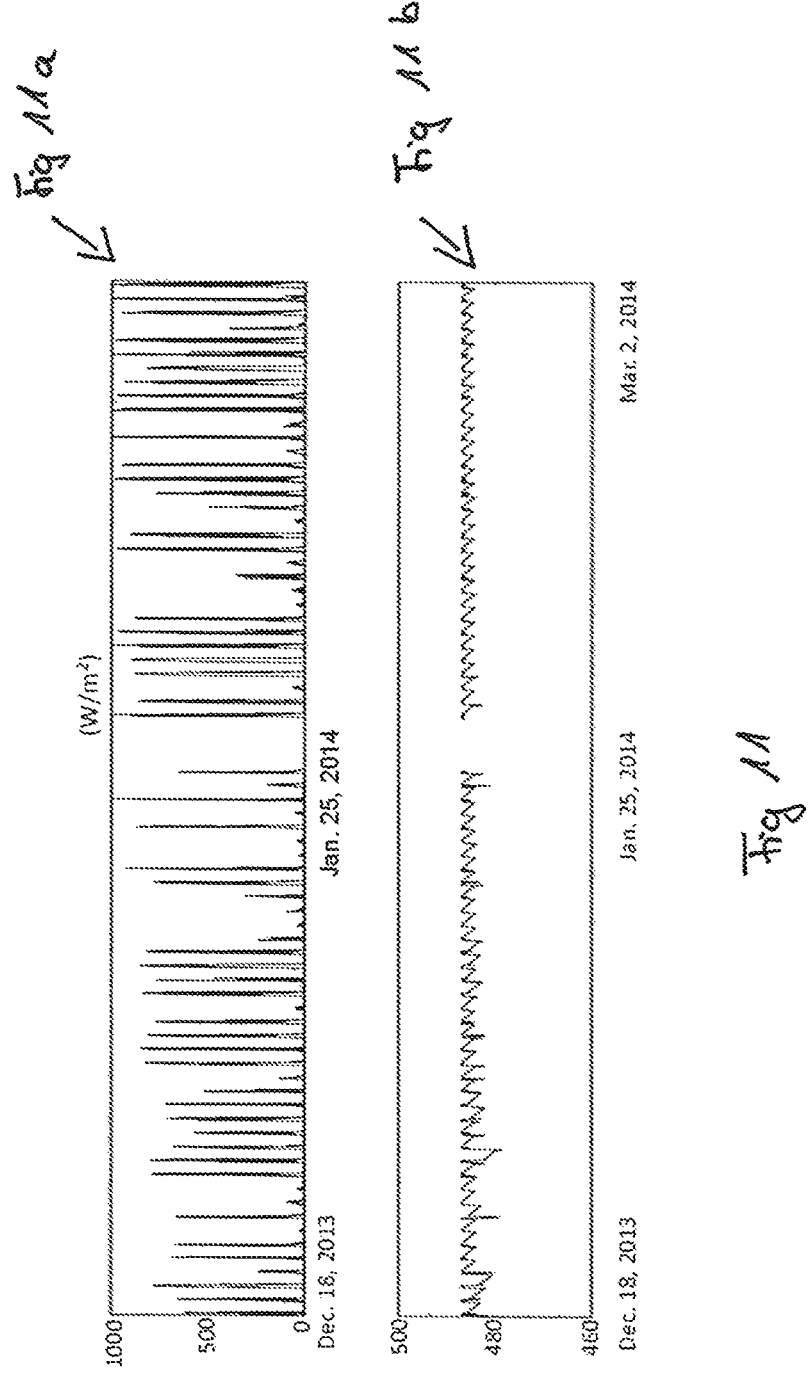

OPTICAL DEVICE WITH POWER SUPPLY SYSTEM

The invention pertains to an optical device comprising at least one glass or polymer area, whereby an active matrix is located in contact with the at least one glass or polymer area, the optical device comprises also a power supply system.

Such optical devices are known in form of switchable windows.

Document JP 2004012818 discloses a liquid crystal window with a solar cell and batteries, which suggests to placing the battery and controller in between a sandwich of glass. The downside of this solution is that the connectors to the glass are usually on the edge of the glass plane. Also, battery and controller are visible which is not desired. Battery and controller are exposed to solar heat radiation and therefore heat up to very high temperatures. If controller or battery breaks down, they cannot be replaced easily.

Document U.S. Pat. No. 8,213,074 discloses an electrochromic window wherein the window controller is integrated within the insulating glass unit. While this integrated controller offers advantages over a delocalized controller, as it may save the installation of a separate controller, it is still required to feed power to the system via a grid. Installing cabling through a façade for a connection with the grid may bring extra work and costs.

Document U.S. Pat. No. 6,055,089 discloses an electrochromic window that is powered by a photovoltaic element on the glass surface. This configuration overcomes the need to add external batteries. However, it offers additional assembly issues as the PV element has to be connected to the controller during assembly of the insulating glass unit. This assembly process is not compatible with current insulating glass making machinery, and therefore brings additional costs. In addition, due to the position of the photovoltaic element on the glass surface, the photovoltaic element has a high stress strain.

Document U.S. Pat. No. 7,259,730 discloses a display element fixed on a window. Several locations are suggested for the control system which includes a battery pack for powering the window. As there is no system included to recharge the battery, the battery should be changed when it is discharged. This may be undesirable for some applications e.g. for use as a window, as not all locations are easily accessible. Furthermore, the exchange of batteries brings additional work, which can be done if there are only a few windows installed, but for installations with a large number of windows, this will lead to a high maintenance cost.

The aim of the invention is therefore to overcome the disadvantages of the prior art.

The aim is achieved by an optical device comprising at least one glass or polymer area, whereby an active matrix is located in contact with the at least one glass or polymer area, the optical device comprises a power supply system, whereby the power supply system is located between a first-auxiliary plane arranged on top and approximately parallel to the at least one glass or polymer area and a second auxiliary-plane, arranged approximately parallel and in a distance L' of less than 10 cm from the first-auxiliary plane and in a distance L less than 21 cm away from a third auxiliary-plane or a fourth auxiliary-plane, which are arranged approximately perpendicular to the main extension direction of the at least one glass or polymer area, whereby L is also the distance between the third auxiliary-plane and a side of the at least one glass or polymer area and the same side of the at least one glass or polymer area and the fourth auxiliary-plane. The power supply system comprises at least a controller and at least one energy storing system. The optical device comprises at least one photovoltaic element, whereby the at least one photovoltaic element is arranged approximately perpendicular to the main extension area of the at least one glass or polymer area.

In one embodiment the controller is used for controlling the battery.

The at least one energy storing system is preferably at least one battery.

The optical device comprises at least one, preferably more than two and most preferably four or more photovoltaic element(s). The controller preferably temporarily stores the generated power (of the at least one or more photovoltaic element(s)) in the battery and uses the power stored in the battery to control the state of the optical device. If the optical device is a switchable window, the benefit of a switchable window with photovoltaic element, controller and battery is that one does not need external electricity for switching the switchable window, and the cabling through the facade (for an external power supply) can be reduced. Preferably the at least one photovoltaic element is in physical contact with the at least one glass or polymer area.

With physical contact it is meant that it is mechanically fixed to the glass or polymer area.

The at least one glass or polymer area has a main extension direction and two surfaces of the at least one glass or polymer area runs parallel to this main extension direction. The main extension direction of the first auxiliary-plane is parallel to the main extension direction of the at least one glass or polymer area. In addition, the at least one glass or polymer area has four sides (or edges) which are approximately perpendicular to the two surfaces of the area and due to the sides the two surfaces of the at least one glass or polymer area are in contact with each other. The thickness of the sides of the at least one glass or polymer area are given by the thickness of the area itself.

The active matrix is in contact with the at least one glass or polymer area, whereby the term "contact" means preferably a physical contact. This means the active matrix is preferably attached, applied and/or insert to or on the at least one glass or polymer area.

Preferably, the optical device comprises two or three glass or polymer areas instead of the at least one glass or polymer area (see for example FIG. 5, area 15/1 and 15/2). In this preferred case the glass or polymer areas are parallel to each other; this means the main extension direction of the areas are parallel to each other. In such an embodiment the active matrix is preferably arranged between at least two glass or polymer areas. Preferably, the areas are—via a surface—in contact with each other due to the active matrix.

Preferably the optical device comprises at least one additional area (also referred to as additional area). The at least one additional area has a main extension direction which is approximately parallel to the main extension direction of the at least one glass or polymer area, whereby the additional area is located in a distance to the at least one glass or polymer area. To avoid misunderstandings, even if the at least one glass or polymer area can be made of two or three glass or polymer areas, these areas are not the at least one additional area (see for example FIG. 5, area 2). Also the additional area may comprise two or three glass or polymer areas. In one preferred embodiment the at least one additional area is built up like the optical device according to claim 1. Preferably, the additional area protects the at least one glass or polymer area and has preferably an insulating function. If the optical device is a switchable window, the at least one additional area may part of a double, triple or quadruple glazing.

The term "approximately parallel" means in all cases that there is no more than 5 to 10° variance. The term "approximately perpendicular" means in an angle in the range of about 85 to 95°.

The power supply system is located in a space or room (or volume) between the at least one glass or polymer area and the second-auxiliary plane. This space or room for the power supply system is built up by the first auxiliary plane which runs parallel and on top of the at least one glass or polymer area and parallel to the main extension plane of the at least one glass or polymer area. The term "on top" means that the first-auxiliary plane is located on the outer surface of the at least one glass or polymer area. The outer surface of the at least one glass or polymer area is the surface of the at least one glass or polymer area which has the greatest distance to the main extension direction of the second auxiliary-plane. The second auxiliary-plane runs preferably through the additional area but in all cases in a distance to the first auxiliary-plane and parallel to the main extension direction of the at least one glass or polymer area. The first and the second auxiliary-planes have a distance to each other of less than 10 cm, preferably a distance between 8 to 1 cm, more preferred a distance between 3 to 0.5 cm. The first and the second auxiliary-planes limit the extension for the room or space for arranging the power supply system in a horizontal direction. The third auxiliary-plane and the fourth-auxiliary plane are approximately perpendicular to the first and second auxiliary-planes and approximately parallel to the sides of the at least one glass or polymer area. The third auxiliary-plane and also the fourth-auxiliary plane limit the extension for the space or room (for arranging the power supply system) in a vertical direction. The third auxiliary-plane and the fourth auxiliary-plane are located less than 21 cm away from one side of the at least on glass or polymer area (see FIG. 13). The third auxiliary-plane and the fourth auxiliary-plane have a distance of less than 42 cm, preferably 41 to 20 cm, more preferred between 30 to 10 cm from each other.

As mentioned, the at least one energy storing element is preferably a battery, more preferred a rechargeable battery. The rechargeable battery stores the energy generated by the at least one photovoltaic element and applies the energy to the optical device (if required). The battery is preferably selected based on the energy requirement of the optical device. In this respect the kind of optical device (for example a window or a screen), the minimum lifetime of the battery, the operating temperature of the battery, the dimension of the battery and the costs are selection criteria. In one embodiment the battery can be a supercapacitor, a nickel-metal-hybrid (NiMH) battery or a thin film battery. An example of a super capacitor is a Maxell BCAP 0350, an example of a NIMH battery is a Varta V150HT and an example of a thin film battery is Cymbet CBC3150.

The power supply system is arranged between the at least one glass or polymer area and the at least one additional glass or polymer area and/or in a distance to one side of the at least one glass or polymer area. In all embodiments the power supply system is arranged in the space or room (or the volume) built up by the first, second, third, and fourth auxiliary-planes described above. In one special embodiment at least one part of the power supply system (controller or energy storing device) is arranged in the defined room or space. In this special embodiment parts of the power supply system may be arranged outside of this defined room or space. In another (more preferred) embodiment all parts of the energy supply system are arranged in the defined room or space.

An optical device with a power supply system arranged in the described room or space has a plurality of advantages. One of these advantages is that the optical device can be built as an integrated product in the factory and does not require connecting cables on the building site, which can be a cause for product failures and is complex in the construction process.

Preferably, the power supply system is at least partially covered by a frame. The frame covers preferably also parts of the optical device, preferably parts of the at least one glass or polymer area. If the optical device is a switchable window, the frame is preferably the window frame. Another benefit for arranging the power supply system in the described room or space is that the power supply system is not visible to a viewer, who looks at the optical device. In addition to this the power supply system is covered by the frame and therefore protected against external forces, dust, moisture and direct sun-radiation.

The term "at least partially covered" means that at least 70%, more preferred at least 90% and most preferred 95% of the power supply system is covered by the frame. In one preferred embodiment all parts of the power supply system are entirely covered by the frame.

Preferably the controller temporarily stores the generated power (of the at least one photovoltaic element) in the battery and uses the power stored in the battery to control the state of the optical device. If the optical device is a switchable window, the benefit of a switchable window with photovoltaic element, controller and battery is that one does not need external electricity for switching the switchable window, and the cabling through the facade (for an external power supply) can be reduced. Preferably the at least one photovoltaic element is in physical contact with the at least one glass or polymer area. In an example for such a physical contact the at least one photovoltaic element is attached and/or applied on the at least one glass or polymer area e.g. on a side of the at least one glass or polymer area.

Preferably the at least one photovoltaic element is a thin film. Thin means the film has a thickness which is preferably smaller than 90 µm, more preferred smaller than 50 µm, most preferred smaller than 10 µm and especially preferred smaller than 60 nm. Useful examples for a photovoltaic element are organic photovoltaic cells (OPV) like dye sensitized solar cells (DSSC) (Titanium dioxide and organic dyes mixture) or organic/polymer solar cells (polymer and organic dye and fullerene derivative mixture). Further inorganic thin film solar cells (TFSC) like amorphous silicon (a-Si), thin film silicon (TF-SI) Cadmium telluride (CdTe), copper indium gallium selenide (CIS or CIGS) are useful. In general, the at least one photovoltaic element preferably absorbs light in the infra-red and ultra violet ranges. Preferably the photovoltaic element has a transparency of more than 30%, more preferred more than 50% and most preferred more than 70%.

The electronics for the at least one photovoltaic element are preferably invisibly located in the frame of the optical device. The benefit of the location for the electronics is that there is no chance for direct radiation from the sun and therefore the climate there is somewhat milder, thereby relaxing the lifetime demands on the electronics. In this embodiment, a mechanical connection should be placed between the at least one glass or polymer area and the additional area.

The at least one photovoltaic element is preferably fixed with or on a spacer. Such a spacer is a tube or bar that functions to space glass or polymer areas (for example the at least one glass or polymer area and the additional area) to build an insulating glass or polymer unit. The at least one photovoltaic element is arranged approximately perpendicular to the main extension direction of the at least one glass or polymer area, onto this spacer facing to the inside of the device. Thus, the at least one photovoltaic element is arranged parallel to the third or fourth auxiliary-plane. If the optical device is a window, the spacer is preferably a window spacer. In such case, the spacer can optionally include a fixation for the window controller and a lead-through for the photovoltaic (PV) wiring. If more than one photovoltaic elements are used, the more than one photovoltaic elements are preferably arranged on different sides of the spacer, facing to the inside of the device (see FIG. 8).

The benefit of integration of the at least photovoltaic element in the mentioned position within the optical device and especially with the spacer is that the window control system including power supplying PV element(s) can be manufactured in a separate process from the switchable glazing element. The glass and the spacer are joined in the insulating unit manufacturing process. With this controller set-up on the spacer, this process can be performed on regular insulating glass making lines, as if it were a regular window. Furthermore, any yield issues in the assembly of the window controller or PV will not affect the yield of the switchable window manufacturing (or vice versa), thus offering costs savings.

It should be noted that in this configuration, the at least one PV element is not facing directly into the light. Moreover, as the optical device, preferably a switchable window, is typically placed on the sun-facing side of the insulating glass unit, the at least one PV element is behind the optical device (e.g. switchable window). They thus receive significantly less light than what they would receive in case of a direct placement in the sun. It was therefore surprising to find that such a configuration still provides sufficient power to operate the optical device throughout the year. There are a number of benefits for using this location of the PV element. On the spacer, the PV element does not limit or block the view through the optical device e.g. a switchable window. Also, the location is much less obtrusive than when the PV element(s) are placed parallel (flat) onto the glass and offer therefore aesthetic advantages. In terms of robustness of the solution, this location is well protected from mechanical impact, from high temperatures and direct radiation. Also, it simplifies the assembly of the insulating glass unit, as the PV-with-spacers units can be prepared separately from the glass or polymer panes. As the glass or polymer panes are often heavy and need some mechanical processing, there is a chance of production losses due to mechanical impact on the expensive PV element(s) if they would be fixed to the glass or polymer panes.

Preferably more than one—most preferred two to four— photovoltaic elements are used for the optical device. Preferably the at least one photovoltaic element is placed on the inside area of the spacer. The inside area of the spacer is the area which face inside of the optical device (see FIG. 8). If more than one photovoltaic element used, all or some of the photovoltaic elements are arranged on the inside area of the spacer. It is preferred to use a separate maximum powerpoint tracking device (MPPT). Especially in case where more than one photovoltaic elements are used the maximum powerpoint tracking device is connected to photovoltaic elements for each side of the optical device. A maximum powerpoint tracker is a an electronic device that optimizes the voltage and current supplied by a photovoltaic element for maximum power output. As every side of the optical device (and thus every side of the spacer with the photovoltaic element (s)) experiences a different light intensity during the day due to the movement of the sun in the sky, a separate MPPT ensures that the optimal power is extracted from each strip of the photovoltaic elements (solar cells).

In a preferred embodiment the power supply system is reversibly removable from the optical device. In this special embodiment the power supply system is clicked on the optical device and can be removed without destroying the optical device. Due to this, a replacement of the power supply system is easily possible and a defect power supply systems does not result in an acquisition of a complete novel optical device. In this embodiment the power supply system is not arranged between the at least one glass or polymer area and the at least one additional area but rather on the side of the at least one glass or polymer area and the at least one additional glass or polymer area in a distance of less than 15 cm from the third auxiliary-plane (and therefore within the distance L).

Preferably, the active matrix of the optical device contains liquid crystals.

In a preferred embodiment the liquid crystals are polymer dispersed liquid crystals, guest-host liquid crystals and/or polymer stabilized cholesteric liquid crystals.

In one other embodiment the optical device is an electrochromic device or a suspended particle device.

Preferably, the optical device is a switchable layer. A switchable layer is a layer that changes its transmissive properties under influence of an electrical current or voltage. These switchable layers are known in the art as switchable windows and can be electrochromic layers, PDLC (polymer dispersed liquid crystals) layers, guest-host liquid crystal layers, suspended particle devices or cholesteric liquid crystal layers.

The invention also pertains to a power supply system for a switchable window, described as an example for an optical device in the paragraphs above. The power supply system comprises at least one controller, at least one energy storing system (preferably at least one battery), whereby in one embodiment the power supply system is reversibly removable with the switchable window. "Reversibly removable" means that the power supply system is mechanically and electronically connected to the switchable window, whereby a replacement of the power supply system does not destroy the switchable window. A simple electronic connection between a power supply system and a switchable window is not a reversibly removable to the optical device in the sense of the invention.

Preferably, the power supply system is locatable in a window frame of the switchable window, whereby the frame covers the optical device at least partially (this means the frame surrounds the power supply system at least partially). The term "locatable in the window frame" means that power supply system does not extend from the plane of the window by more than 5 mm, preferably less than 2 mm. Furthermore, as the cavities of a window frame may contain moisture, the power supply system is sealed against ingress from moisture, for example by using a suitable potting material.

Preferably at least one photovoltaic element is part of the power supply system.

All embodiments for the photovoltaic element, the at least one energy storing element (battery) or the controller described for the optical device are also possible and preferred for the power supply system.

BRIEF DESCRIPTION OF THE DRAWINGS

FIG. 4 shows two photos of an optical device with photovoltaic elements placed perpendicular to a first and second plane.

FIG. 11a shows the vertical irradiance on a photovoltaic element over months.

FIG. 11b shows the battery charge over months for a south facing optical device.

In FIG. 1 schematically a power supply system for an optical device is shown. Under illumination, a photovoltaic element 7 (also mentioned as PV 7, generates an electrical power. The optical device 1 requires power to switch, but this is typically not at the same moment or in the same quantity available as the power that is generated by the PV7. Therefore, they are connected with a controller 5 that takes the power from the PV, temporary stores it in an energy storage system (e.g. a battery 6) and converts it to the desired signal that is to be delivered to the optical device 1. To make sure that the optical device 1 always works, even when there is no sunshine, an energy storage system (battery 6) is connected to the optical device 1. Finding a correct location for the controller 5 and the battery 6 is a problem. In designing the assembly of such a PV 7 driven optical device 1, there are a number of issues that needs to be solved to retain the above mentioned benefits: The PV 7 needs to be placed such that it receives sufficient light in order to operate. The energy storage (battery 6) is a bulky system and needs some significant volume to achieve sufficient capacity for proper operation. The view through the optical device 1 should not be obstructed by these components, especially if the optical device 1 is a switchable window. Also the mentioned components (controller 5, battery 6) need to be shielded from external influences and can therefore not be placed everywhere. For example, temperatures on the surface of a switchable window (as optical device 1) can exceed 60 degrees in full sunlight, which would normally bring significant harm to many rechargeable batteries 6. Any electrical components or cables that are on the outside surface of the switchable window may be exposed to UV radiation, mechanical shock and moisture. A further demand on the placement is that, one would like to be able to access the electrical components, such that they can be replaced in case of failure, without having to replace the complete switchable window.

FIG. 2 shows a switchable window as optical device 1 with a power supply system arranged according to the prior art. According to FIG. 2 the optical device 1 comprises two glass or polymer areas 15 and an additional area 2. Between the areas 15 an active matrix 16 is located. A power supply system is located between the areas 15 and the additional area 2 but outside of a room or space defined in FIG. 9 and therefore visible to a viewer. The power supply system comprises a battery 6 and a controller 5. In addition the switchable window comprises a spacer 4 and a photovoltaic element 7.

FIG. 3 shows schematically a plain view of the prior art switchable window of FIG. 2. As can be seen the power supply system is visible to a viewer and annoys the view.

FIG. 4 shows photos of a switchable window as optical device 1. The photo on top shows a side view of monocrystalline solar cells that are mounted on the inside of a 16 mm wide window spacer 4. The photo at the bottom shows a top view of such a spacer 4 in a window. To demonstrate that such a setup is capable of generating power, the output was measured on a solar simulator with sun incidence, oriented perpendicular to the plane of the window. For a solar cell area of 16.8 $cm^2$, 35.6 mW power was generated. Dye sensitized solar cells (DSSC), as well as thin film photovoltaic, have a relatively higher performance under oblique incident light than regular mono- or multi crystalline solar cells and are thus preferred. In particular, DSSC is advantageous. They have an excellent performance under angles and their photon-electron efficiency increases with lower light intensities. Therefore, DSSC cells offer additional advantages here.

FIG. 5 is side view of a switchable window (as optical device 1), whereby the switchable window is one embodiment of the invention. The new solution provides a way to make an optical device 1, where the battery 6 and controller 5 are in a well-protected environment, not visible to the outside. They do not stick out from the plane of the switchable window. Therefore, it is possible to use any regular window frame for double or triple glazing to install the switchable window. The battery 6 and controller 5 are placed outside the primary seal 3 of the double glazing unit, such that views through the window are unobstructed. In this embodiment the optical device 1 is preferably a switchable window with an active matrix 16. Such a LC (liquid crystal) switchable window 1 can be a PDLC window (polymer dispersed liquid crystal), a guest host LC window, a cholesteric LC or a polarizer based liquid crystal window. The switchable window is typically placed on the outside position of the double glazing unit. At least one glass or polymer area 15/1 is combined with a second (glass or polymer) area 15/2, whereby the active matrix 16 is located between both areas 15/1, 15/2. In the following the at least one glass or polymer area 15/1 and the second area 15/2 are indicated as areas 15. With an additional glass (or polymer) area 2, a double glazing unit is made. The two glass or polymer areas 15 (or panes) and the additional area 2 (or pane) are separated by a window spacer 4, typically in a size of 6 to 30 mm and the power supply system (controller 5 and battery 6) is located between the areas 15 and the additional area 2. On and around the switchable window spacer 4, a sealing material 3 is applied that provides mechanical strength and gas tight sealing of a gas filled compartment 8. The battery 6 and the controller 5 are placed outside this compartment, in the volume of the insulating glass unit. Preferably the design is such that the distance L is less than 20 cm, preferably even less than 15 cm, such that the window fits in normal window frames without any items obstructing the view. One possible location for a solar cell as photovoltaic element 7 is inside the gas filled compartment 8. This figure shows a side view of a switchable window according to an example of the invention. In this embodiment it is avoided to have the photovoltaic element 7 in the visible area of the switchable window. Therefore, the photovoltaic elements 7 are placed on the inside of the window spacer 4.

FIG. 6 is a top view of the embodiment according to FIG. 5. The controller 5 and the battery 6 are arranged on the side of the optical device 1. The photovoltaic element 7 is not visibly arranged on the side of the optical device 1. Light can pass to the photovoltaic element 7 by reflection on the areas 15, 2 or by direct radiation.

FIG. 7 shows schematically a side view of a switchable window according to a further example of the invention. In this second example, the battery 6 and the controller 5 are placed outside the length of the areas 15 and 2, but still between the areas 15 and the additional area 2 of the two outer surfaces of the insulating glass units. The benefit of this solution is that it provides some additional space for the electronics and the insulating glass unit can be manufactured with standard techniques. In this design, it is preferred to protect the electronics with an enclosure 9 to protect the electronics from external influences. The electronics are invisibly located in a window frame 10. The benefit of this location is that there is no chance for direct radiation from the sun and therefore the climate is somewhat milder, thereby relaxing the lifetime demands on the electronics. In this embodiment, a mechanical connection should be placed between the areas 15 and the additional area 2 and the enclosure 9. The support blocks any force from the switchable window to the enclosure 9, avoiding that the electronics get damaged. In the embodiment of FIG. 7 the enclosure 9 houses the controller 5 and the battery 6. Because the photovoltaic element 7 needs to be facing the light, the enclosure 9 should now stick out of the window frame 10. It has the same thickness as the switchable window, such that it forms a part of the unit (areas 15 and additional area 2). However, it can be assembled onto the unit after the sealant 3 has been applied. This offers production benefits. Furthermore, a modular approach can be used, because the power supply system in combination with the photovoltaic element 7 can simply be 'clicked' onto the switchable window to make it a self-powering system. However, for a wired system, the same production method can be used, but then without 'clicking on' the power supply system in combination with a photovoltaic element 7. Also in this embodiment the power supply system is arranged between a first and a second auxiliary plane 11, 12 (not shown in FIG. 7) and between a third and a fourth auxiliary-plane 13, 14 (not shown in FIG. 7).

FIG. 8 shows schematically an optical device 1 in form of a switchable window. A glass or polymer area 15, comprising the at least one glass or polymer area 15/1 and the second glass or polymer area 15/2 (not shown), is separated from an additional area 2 (not shown) via the spacer 4. On the inside face of the spacer 4 (inside face means facing to the middle of the optical device e.g. the switchable window), photovoltaic elements 7 are placed. In the example of FIG. 8 four photovoltaic elements 7 are placed on four areas of the spacer 4, whereby al photovoltaic elements 7 are arranged in such a way that they are facing to the inside of the optical device 1. Due to this arrangement and the amount of photovoltaic elements 7 the photovoltaic elements 7 are able to receive indirect sun light in a sufficient manner for controlling and switching the optical device 1 (e.g. switchable window). The switchable window of FIG. 8 comprises also a controller 5, a battery 6 (as energy storing device) and a connector 18.

The connector 18 allows a one-time or reversible electrical connection between the window and the control system, which is waterproof and are small enough to fit into the cavity of a window frame. For example, connectors from the JST JWPF series are suitable for this purpose.

Figure 9:
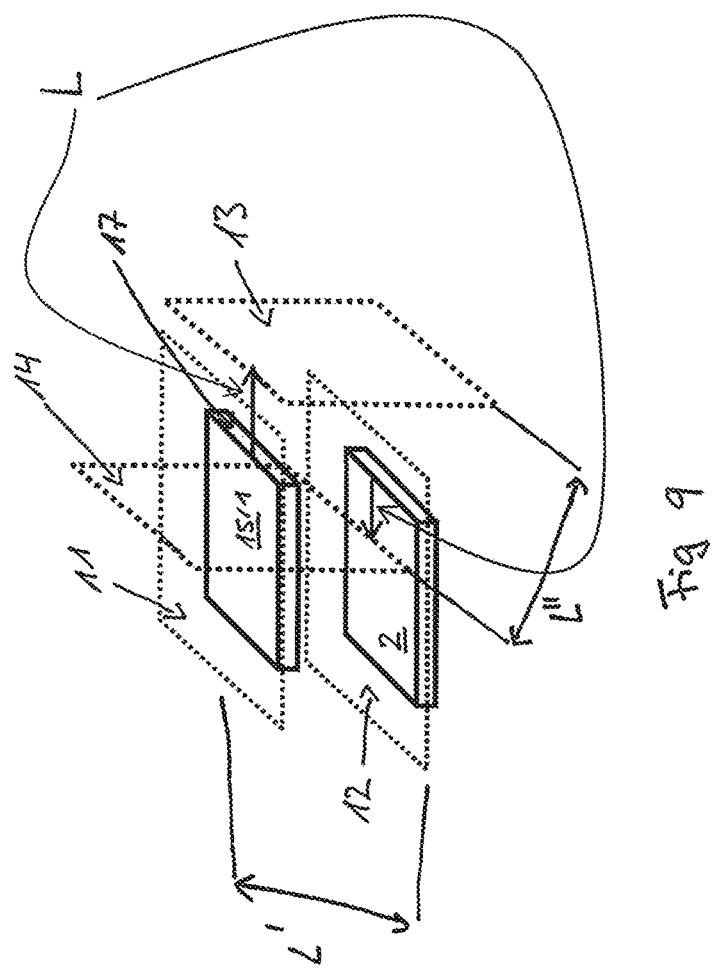
FIG. 9 shows schematically a first, second, third and fourth auxiliary-plane and distances L, L' and L".

In FIG. 9 the room or space for arranging the power supply system claimed in claim 1 is explained in more detail by using a first auxiliary-plane 11, a second auxiliary-plane 12, a third auxiliary-plane 13 and a fourth auxiliary-plane 14. The at least one glass or polymer area 15/1 (also mentioned as area 15/1) is arranged in a distance to the additional area 2. If the at least one glass or polymer area 15/1 comprises more than one area, the area 15/1 is the outer area of the at least one glass or polymer area and thus the outer area of the optical device 1. Further areas (as part of the at least one glass or polymer area 15/1) are arranged in the direction of the additional area 2. The first auxiliary-plane 11 is arranged on top of the at least one glass or polymer area 15/1 and runs parallel to the main extension direction of the first area 15/1. The second auxiliary-plane 12 runs also parallel to the main extension direction of the first area 15/1 but in a distance to the first auxiliary-plane 11 and the area 15/1. The distance L' between the first auxiliary-plane 11 and the second auxiliary-plane 12 is preferably less than 10 cm and most preferred between 1 to 6 cm. If the optical device 1 comprises an additional area 2, the second auxiliary-plane 12 runs preferably through the additional area 2 and parallel to the main extension direction of additional area 2. The third auxiliary-plane 13 is approximately perpendicular to the first auxiliary-plane 11 and the second auxiliary-plane 12, whereby the third auxiliary-plane 13 is located in a distance L of less than 21 cm away from a side 17 of the at least one glass or polymer area 15/1. The fourth auxiliary-plane 14 is also located approximately perpendicular to the area 15/1 and the first auxiliary-plane 11 and in a distance L of less than 21 cm to the same side 17 of the area 15/1 (as for third auxiliary-plane 13) and in a distance L" (L+L) to the third auxiliary-plane 13 of less than 42 cm. The power supply system is located between the first auxiliary-plane 11 and the second auxiliary-plane 12 and also between the third auxiliary-plane 13 and the fourth auxiliary-plane 14, whereby the auxiliary-planes 11, 12, 13, and 14 built up a defined room or a space (or volume). The first auxiliary-plane 11 and the second auxiliary plane 12 restrict the room or volume (for arranging the power supply system) in a horizontal way. Thus, the power supply system must be arranged between the at least one glass or polymer area 15/1 and the second auxiliary-plane 12 (and additional area 2). The third and the fourth auxiliary-plane 13, 14 restrict the room or space (for arranging the power supply system) in a vertical way, whereby the third auxiliary-plane 13 and also the fourth auxiliary-plane 14 are in a distance L to an end of the at least one glass or polymer area 15/1 (and also to the additional area 2), whereby L is less than 21 cm. The term "approximately perpendicular" means in an angle between 85 to 95°, more preferred in an angle of 89 to 91° and most preferred in an angel of 90°.

Figure 1:
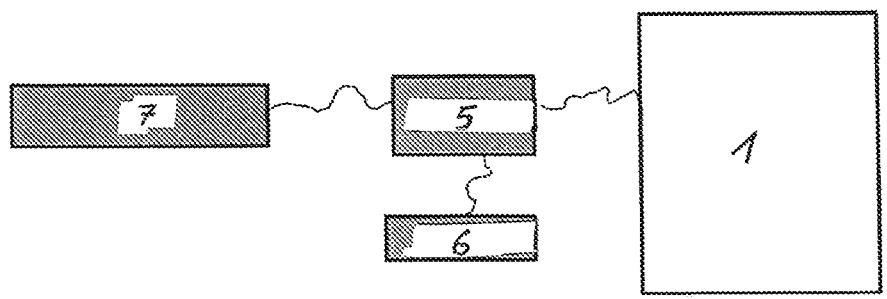
FIG. 1 shows schematically a power supply system in combination with a photovoltaic element and an optical device.
Figure 2:
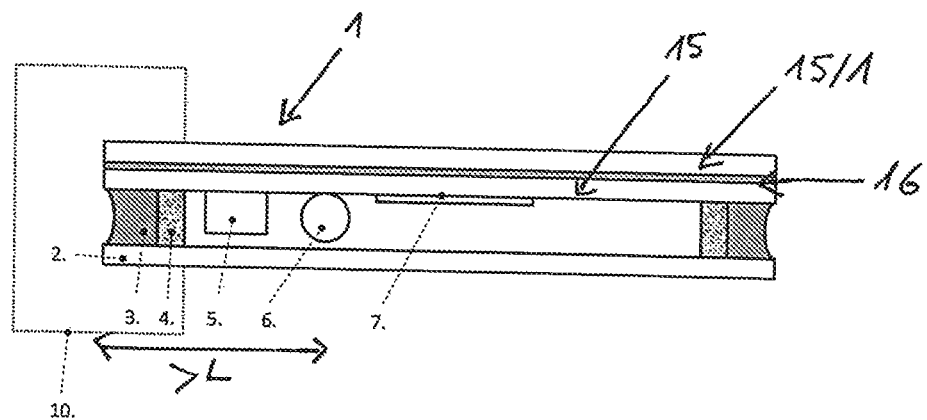
FIG. 2 shows schematically an arrangement of a power supply system of the prior art in a side view.
Figure 3:
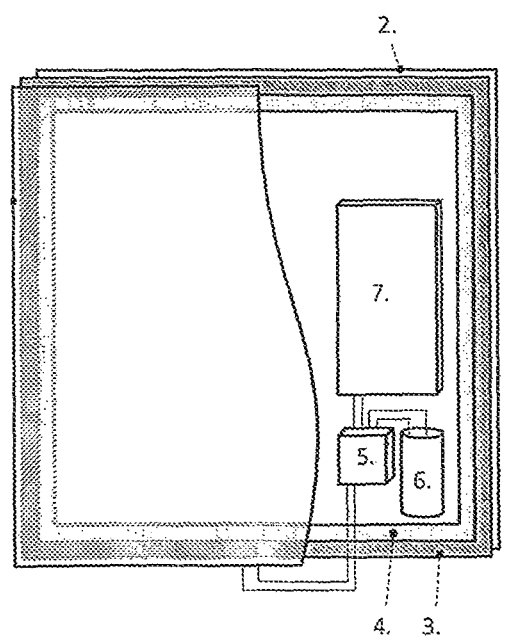
FIG. 3 shows schematically an arrangement of a power supply system of the prior art in a plain view.
Figure 5:
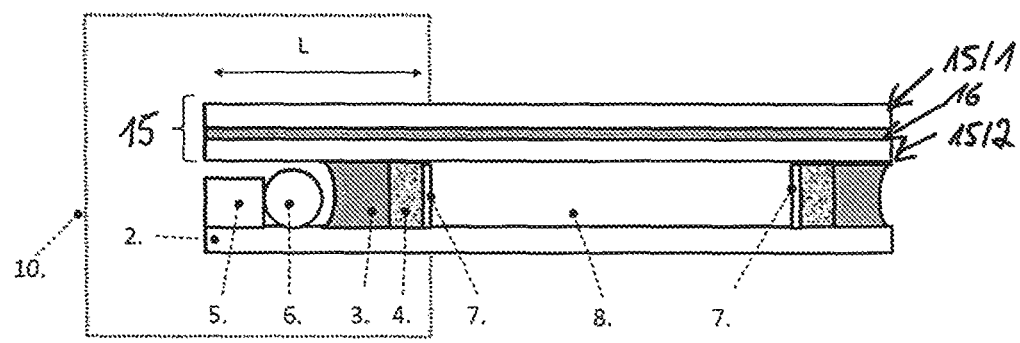
FIG. 5 shows schematically an example of FIG. 4 with an arrangement for a power supply system in a side view and photovoltaic elements arranged perpendicular.
Figure 6:
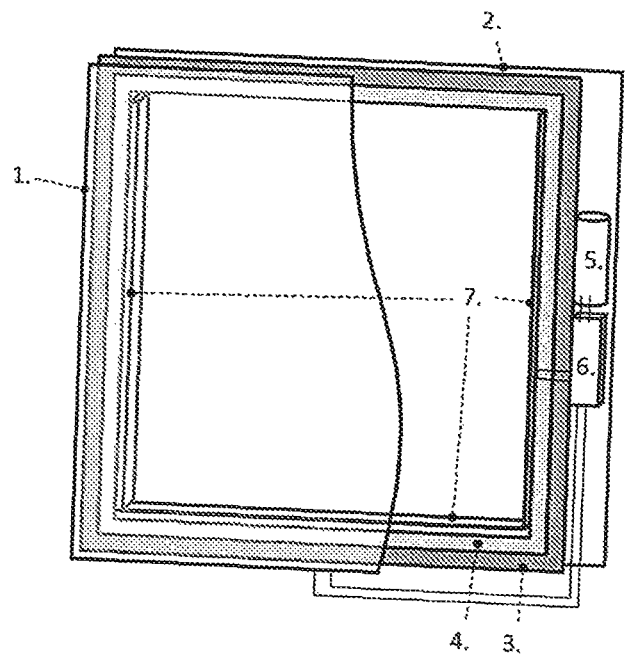
FIG. 6 shows schematically an example of FIG. 4 with an arrangement for a power supply system in a plain view.
Figure 7:
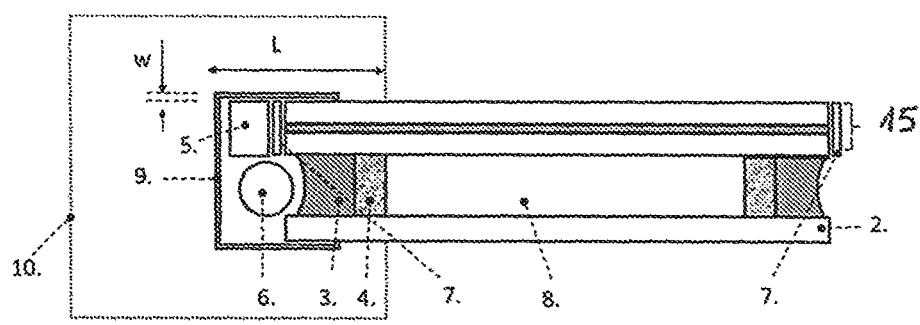
FIG. 7 shows schematically a further example of an arrangement for a power supply system.
Figure 8:
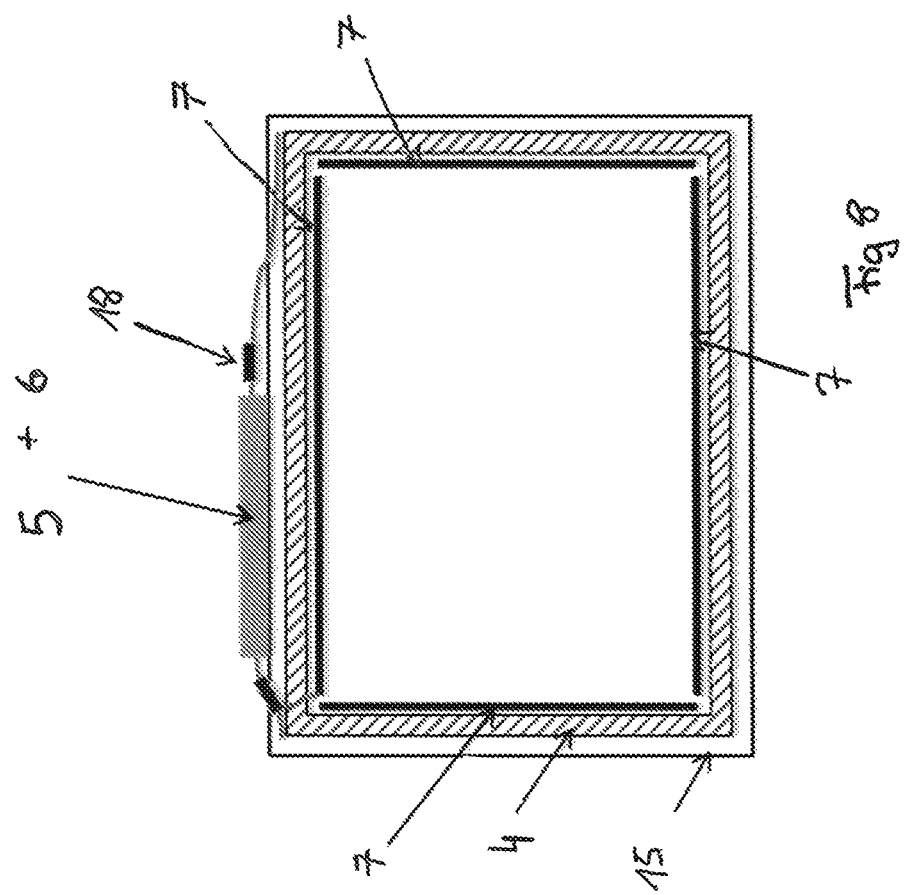
FIG. 8 shows schematically a switchable window as optical device with a power supply system and photovoltaic elements.
Figure 10:
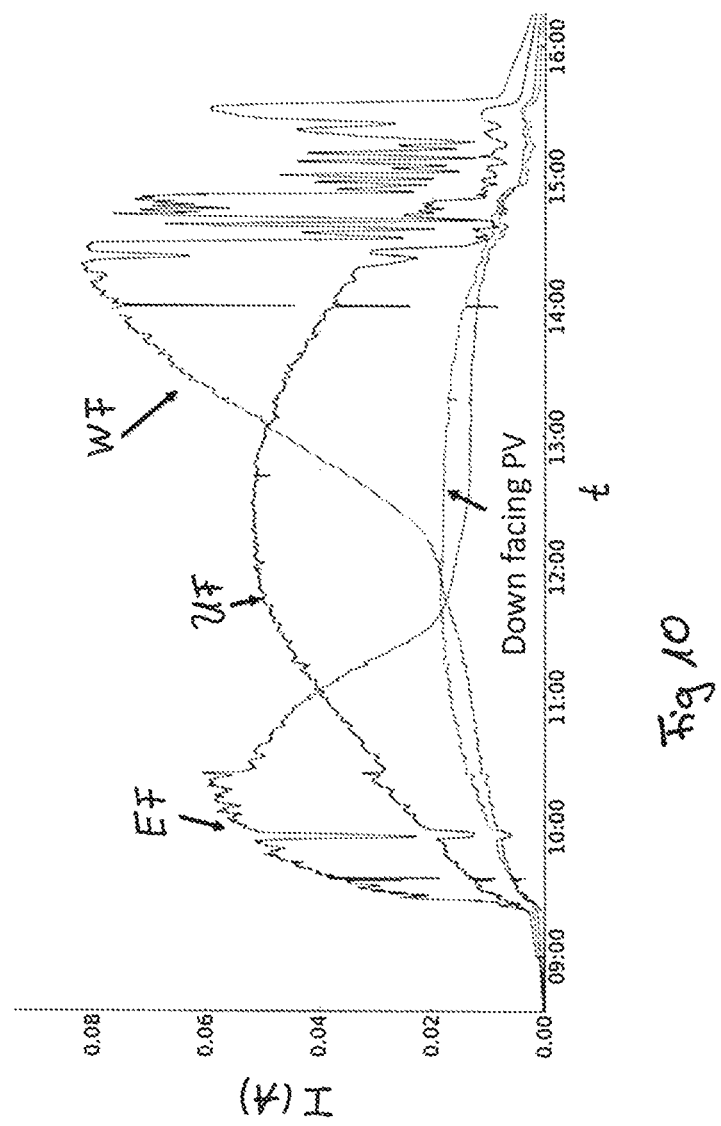
FIG. 10 shows the generated power of different photovoltaic elements over one day placed on different sides of the optical device.

FIG. 10 shows the generated current of a switchable window as optical device 1 with a buildup according to FIG. 8 over one day. The EF curve is the generated current of an east facing photovoltaic element. The UF curve is the generated current of an upwarding facing photovoltaic element. The WF curve is the generated current of a west facing photovoltaic element and the DF curve is the generated current curve of a down facing photovoltaic element. The current is a measure for the power generated by the PV elements. The figure shows that even though the downward facing element (curve DF) is not generating as much current as the other elements, it is still a significant contribution. Also, it shows that the power that is generated differs strongly between the different photovoltaic elements. Therefore, using a separate maximum powerpoint tracker for each element can optimize the power output from every side.

The invention is described in detail by a working example, whereby the working example is only one embodiment of the invention and does not restrict the invention.

WORKING EXAMPLE

A dye-doped guest host LC window as optical device was build and tested for autonomous operation. The insulation glass window had dimensions of 110×105 cm with a thickness of 28 mm. From the outside to the inside, the window was build up with an: a first glass pane (15/1), the LC guest host switchable matrix (16) and a second glass pane (15/2) (together 8 mm)—argon gap (16 mm)—low-E coated glass (4 mm) (glass and polymer area 15). On the window spacers, mono crystalline Si PV cells were mounted, six PV cells connected in series per side. All four sides of the window were equipped with PV cells (like demonstrated in FIG. 8 and every side had its own maximum powerpoint tracker (MPPT) As the intensity of light received by each side may vary strongly, it is undesirable to have the side receiving the lowest light intensity to limit the output current. One method to overcome this is to use separate maximum powerpoint trackers for each side, so that the power output from each side is optimized.

The window controller was part of the insulating glass unit. It was powered from a battery (NiMH type, 4 in series, 4.8 V 2200 mAh), which in turn was charged from the PV cells through the maximum powerpoint trackers. The window was equipped with a window controller which could receive commands from the building control system to change the transmissive state of the window. The building control system (not shown) contained multiple sensors registering the light levels inside and outside, and would decide using this information whether the window should be switch dark or bright. Upon receiving more than 100 W/m$^2$ of sunlight on the outer window surface, the window was switched to the dark state by the building control system. When the incident light dropped below 100 W/m$^2$, the window was switched back the transparent state.

The window was placed facing south in the Netherlands. The power output voltage and the battery power level was monitored and stored, as well as the light incident levels for all sides of the building. The results are shown in FIGS. 10 and 11 and prove that the battery never drowns and always remains over 90% charged.

REFERENCE NUMBERS

1 example switchable window)
2 additional area
3 sealant (sealing material)
4 spacer
5 controller
6 battery
7 photovoltaic element (PV)
8 compartment
9 enclosure for electrics
10 frame
11 first auxiliary-plane
12 second auxiliary-plane
13 third auxiliary-plane
14 fourth auxiliary-plane
15/1 at least one glass or polymer area
15/2 second glass or polymer area
15 glass or polymer area
16 active matrix
17 side of the at least one glass or polymer area 15/1
18 connector
L distance between the third auxiliary-plane 13/fourth auxiliary-plane and a side 17 of the at least one glass or polymer area
L' distance between the first auxiliary-plane 11 and the second auxiliary-plane 12
L" distance between the third auxiliary-plane 13 and the fourth auxiliary-plane
EF curve
UF curve
WF curve
DF curve

The invention claimed is:

1. An optical device comprising at least one glass or polymer area, whereby an active matrix is located in contact with the at least one glass or polymer area, the optical device comprises a power supply system, characterized in that the power supply system is located between a first-auxiliary plane arranged on top and approximately parallel to the at least one glass or polymer area and a second auxiliary-plane arranged approximately parallel to and in a distance L' of less than 10 cm from the first-auxiliary plane, and the power supply located in a distance L of less than 21 cm away from a third-auxiliary plane or a fourth-auxiliary plane which are arranged approximately perpendicular to the main extension direction of the at least one glass or polymer area, whereby L is also the distance between the third-auxiliary plane and a side of the at least one glass or polymer area and the same side of the at least one glass or polymer area and the fourth-auxiliary plane, whereby the power supply system comprises at least a controller and at least one energy storing device, and whereby the optical device comprises at least one photovoltaic element placed in direct physical contact with a spacer and the at least one glass or polymer area, whereby the at least one photovoltaic element is arranged approximately perpendicular to the main extension area of the at least one glass or polymer area.

2. The optical device according to claim 1, whereby the power supply system is at least partially covered by a frame, whereby the frame covers the at least one glass or polymer area.

3. The optical device according to claim 1, whereby the at least one photovoltaic element is a thin film solar cell.

4. The optical device according to claim 1, wherein one maximum powerpoint tracking device is used for the at least one photovoltaic element.

5. The optical device according to claim 1, whereby the optical device comprises an additional area, wherein the at additional area is a glass or polymer area, and the additional area is in contact with at least one additional photovoltaic element.

6. The optical device according to claim 1, whereby the power supply system is reversibly removable from the optical device.

7. The optical device according to claim 1, whereby the active matrix contains liquid crystals.

8. The optical device according to claim 7, whereby the liquid crystals are polymer dispersed liquid crystals, guest-host liquid crystals or polymer stabilized cholesteric liquid crystals.

9. The optical device according to claim 1, whereby the optical device is an electrochromic device or a suspended particle device.

10. The optical device according to claim 1, whereby the optical device is a switchable window.

\* \* \* \* \*